(12) United States Patent
Leenstra et al.

(10) Patent No.: US 6,518,793 B2
(45) Date of Patent: Feb. 11, 2003

(54) EMBEDDING OF DYNAMIC CIRCUITS IN A STATIC ENVIRONMENT

(75) Inventors: Jens Leenstra, Bondorf (DE); Hans-Werner Tast, Weil i.Sch. (DE); Dieter Wendel, Schoenaich (DE); Peter Hofstee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/815,355

(22) Filed: Mar. 22, 2001

(65) Prior Publication Data

US 2001/0026172 A1 Oct. 4, 2001

(30) Foreign Application Priority Data

Mar. 31, 2000 (EP) ............................................. 00106884

(51) Int. Cl.$^7$ ........................ H03K 19/00; H03K 3/017
(52) U.S. Cl. ........................................ 326/93; 327/176
(58) Field of Search ................................ 326/93, 95, 98; 327/217, 176, 298, 158; 365/185.21, 205, 207

(56) References Cited

U.S. PATENT DOCUMENTS 5,453,708 A * 9/1995 Gupta et al. ................... 326/98
5,557,620 A * 9/1996 Miller, Jr. et al. ......... 371/22.5

* cited by examiner

*Primary Examiner*—Daniel D. Chang
(74) *Attorney, Agent, or Firm*—Lynn L. Augspurger, Esq.; Kevin P. Radigan, Esq.; Heslin Rothenberg Farley & Mesiti P.C.

(57) ABSTRACT

The present invention relates to improvements concerning logic and timing verification as the testability of a hardware circuit comprising embeddings of dynamic logic circuits in a static environment. The clocked macros comprising the dynamic logic circuit are bounded at both input and output by latches, keeping input and output signals to the clocked macro static. The static input signals are processed with wave formatting means in order to generate a wave form usable for an evaluation by the dynamic logic circuit, and the dynamic logic output signal is converted back to a static signal by a set/reset latch such that it can be latched by the clock signal of the static embedding circuit. Thus, the analysis methods for timing and logic simulation during chip design can be the same as those used for static logic and, in particular, the LSSD testing methods can be used.

19 Claims, 3 Drawing Sheets

EMBEDDING OF DYNAMIC CIRCUITS IN A STATIC ENVIRONMENT

PRIOR FOREIGN APPLICATION

This application claims priority from European patent application number 00106884.0, filed Mar. 31, 2000, which is hereby incorporated herein by reference in its entirety.

TECHNICAL FIELD

The present invention relates to hardware development and chip design. In particular, it relates to improvements concerning the logic and timing verification as testability of a hardware circuit comprising embeddings of dynamic logic circuits in a static environment.

BACKGROUND ART

Any hardware design which is subjected to modern design technology has to fulfill a plurality of requirements in order to be up to date and attractive for the client. Thus, any hardware should have a good performance in relation to its prize, it should be robust and reliable, in particular when high-end server logic chips are concerned. In order to create a reliable hardware it must be testable as well as a general requirement for any hardware.

In view of the general must to produce faster logic chips any possibilities are exploited in order to contribute to this aim.

One contribution amongst others is to implement dynamic logic circuits into a logic chip because this is a hardware which performs faster than standard static logic circuits.

A static logic circuit is operated in a way in which every node of it is always connected to either ground or the supply voltage Vdd. Dynamic logic circuits, however, have nodes which are not grounded or connected to Vdd permanently, but instead, the dynamic nodes are precharged to either ground or Vdd and then, during operation of the dynamic logic circuit a node is either drawn to potential ground or Vdd or stays on the precharge level, depending on the desired switching mechanism. During evaluation time, a node staying at the precharge level is said to be floating since precharge is not active and the evaluation tree is noncontacting.

This property of dynamic logic circuits, however, makes testing of the hardware difficult. In particular, when a hardware is subjected to timing analysis by traditional testing utilities and machinery, a prerequisite is that the nodes which are scanned and thus tested for reliability are non-floating. Thus, in prior art, it is not possible to build dynamic logic in risky locations, for example where combinatorial logic is used. In combinatorial logic circuits every node between any predefined number of gates has to be tested in order to make sure that the circuit or parts of it deliver the expected results. Thus, in such risky locations standard static CMOS logic is used.

The growing performance requirements, however make the use of dynamic circuits in more and more selected places desirable. Array structures are an ideal place where dynamic circuits can be used advantageously. The timing can be very structured, the path length is very well known and physical dimensions are fixed and always the same at comparable locations because an array comprises a large number of repetitions of its inner core structure.

Thus it is desirable to embed dynamic logic circuits into static circuits while concurrently keeping the testability provided by LSSD compliant hardware.

SUMMARY OF THE INVENTION

It is thus an object of the present invention to enable dynamic hardware to be embedded into static hardware which is compliant to the LSSD concept.

An object of the invention is achieved by the features stated in enclosed independent claims. Further advantageous arrangements and embodiments of the invention are set forth in the respective subclaims.

According to one aspect of the present invention a technical solution for embedding dynamic logic circuits into a static environment is provided in which the dynamic logic appears encapsulated within clocked macros a term which is used in here as comprising dynamic macros amongst others. The clocked macros are bounded at both input and output by latches, keeping all input and output signals to the clocked macro static. This inventional concept allows to sprinkle dynamic logic at a plurality of locations into each a static hardware environment. In other words, islands of dynamic logic appear in a sea of static logic.

Thus, the analysis methods for timing and logic simulation during chip design can be the same as used for static logic, and in particular the advantageous LSSD testing methods can be used.

Any LSSD circuit configuration requires that all logic paths the input- and output-nodes of which are required to be testable according to the LSSD methods are bounded by a pair of latches, each latch being responsive to an 'independent' clock. In the example shown and described in here, these pairs are exemplarily chosen to be master-slave latches. Master/master pairs would, however, work as well. The present invention is based on the idea to provide a frame around the dynamic logic circuit which provides for properly feeding the dynamic logic circuit with one or more input signals in line with the static logic slave clock and to feed the output signal of the dynamic logic circuit to the posed connected static circuit such that the dynamic circuit output signal is able to be latched into a master latch.

In particular, this is achieved by processing static input signals with wave formatting means in order to generate a wave form usable for an evaluation by the dynamic logic circuit, feeding the wave-formatted signal to the dynamic logic circuit, and converting the dynamic logic evaluation output signal back to a static signal. The conversion should advantageously be performed such that the dynamic logic evaluation output can be latched by the clock signal of the static embedding circuit, i.e. by the next master latch.

Thus, some input adapter means and some output adapter means are associated with the dynamic logic circuit and are connected with its input and output, respectively.

Advantageously the input adapter means can be a clock chopper and a wave formatter, whereas the output adapter means is a set/reset-latch.

In order to provide for a LSSD compliant chip design the slave clock signal is applied to the dynamic logic circuit at predetermined points in time. The slave clock signal passes through the dynamic logic circuit, combined with the input signals and generates its output signal which is converted back to a static signal (extract clock) by a Set/Reset latch allowing to feed it into the master latch. The time regime for the clocked macro is determined by the leading edge of the slave clock signal.

Such an embedding makes the dynamic logic circuit, i.e. the clocked macro appearing as a static circuit which can be combined with other static circuits and—can be tested according to LSSD methods.

The implementation as disclosed in the present invention supports full LSSD testing, including random selftest, at any cycle time equal or longer than the functional cycle.

The clocked macro can be isolated from the surrounding logic, during test to allow individual test sequences for the clocked macro and the macro surrounding logic. The latches feeding the clocked macro as the S/R macro output latches get an additional slave latch to allow independent scanning. The master as the slave scan-clock and the macro clock are independent from C1, C2 clocks during test. To test the macro only, the respective stimuli pattern are scanned into the latches driving the macro. After firing the macro clock the result is received in the output latch and can be observed after scanning the data out. The macro gets into a defined state after power on, since default of all restore devices is ON, precharging all dynamic nodes. No additional test signals as for example, reset after POWER-ON, are necessary. Single clock cycles, as the typical test sequence scan-in, execute one cycle, and scan out are possible.

BRIEF DESCRIPTION OF THE DRAWINGS

A preferred embodiment of the present invention is illustrated by way of example and is not limited by the shape of the figures of the accompanying drawings in which.

Figure 1A:
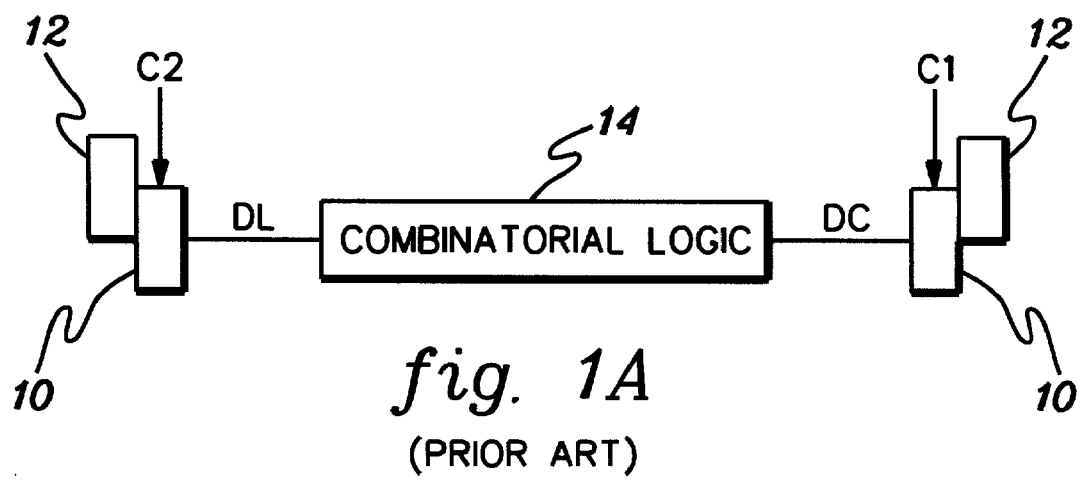
FIG. 1A is a schematic block diagram showing a prior art LSSD configuration in the upper portion of it and FIG. 1B is the associated time behavior of the relevant signals during one cycle.
Figure 1B:
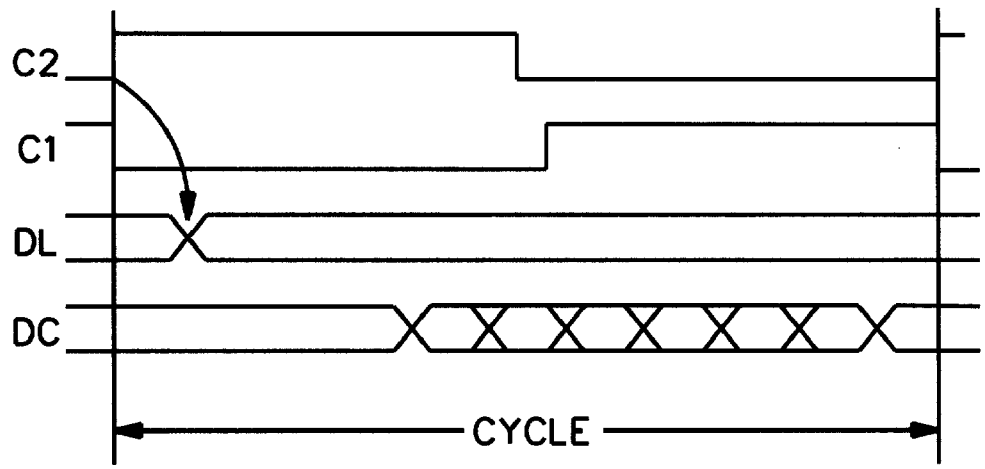

With reference now to FIGS. 1A and 1B, first, an introduction to the LSSD test compliance is given next below.

C1 is the master clock signal, C2 the slave clock signal, DL is the input signal for a combinatorial logic circuit 14 in question, and DC is the output signal thereof.

In a prior art LSSD chip design basically every logic path which is intended to be tested by LSSD testing methods is bounded by a pair of master-slave latches. The input latch is the slave latch whereas the output latch is the master latch.

The cycle starts by launching data from the slave latch 10 with the leading C2 clock edge. The data propagates through the combinatorial logic—and after a delay which is characteristic for the combinatorial logic circuit 14—is captured until the trailing edge of C1 into the master latch 12. Thus, the maximum time limiting the delay for the combinatorial logic 14 is one cycle beginning with the leading edge of C2 and terminated by the trailing edge of C1. For testing purposes the output signal can be scanned out from the master latch 12 via a master/slave scan chain and compared to an expected pattern by a test apparatus. The clock signals C1 and C2, respectively, are commonly derived from one and the same system clock whereby C1 is the inverted C2 signal.

The switching scheme depicted in FIG. 1A can be repetitively continued by setting the next combinatorial logic adjacent to the right, or left margin of the schema depicted in FIG. 1A. This is indicated in the figure by the continuation points at the right and left margin, respectively.

As should be clear now for a person skilled in the art each of the latches 10, 12 can be scanned for timing analysis or logic analysis of a respective combinatorial logic being connected between a respective pair of latches 10, 12. Such a configuration opens up a plurality of LSSD testing methods which are aimed to be reusable for dynamic logic circuits as well according to the present invention.

An embodiment of the test and verification model according to which such dynamic logic can be embedded between the before-mentioned pair of master-slave latches will be described next with reference to FIGS. 2A and 2B.

Figure 2A:
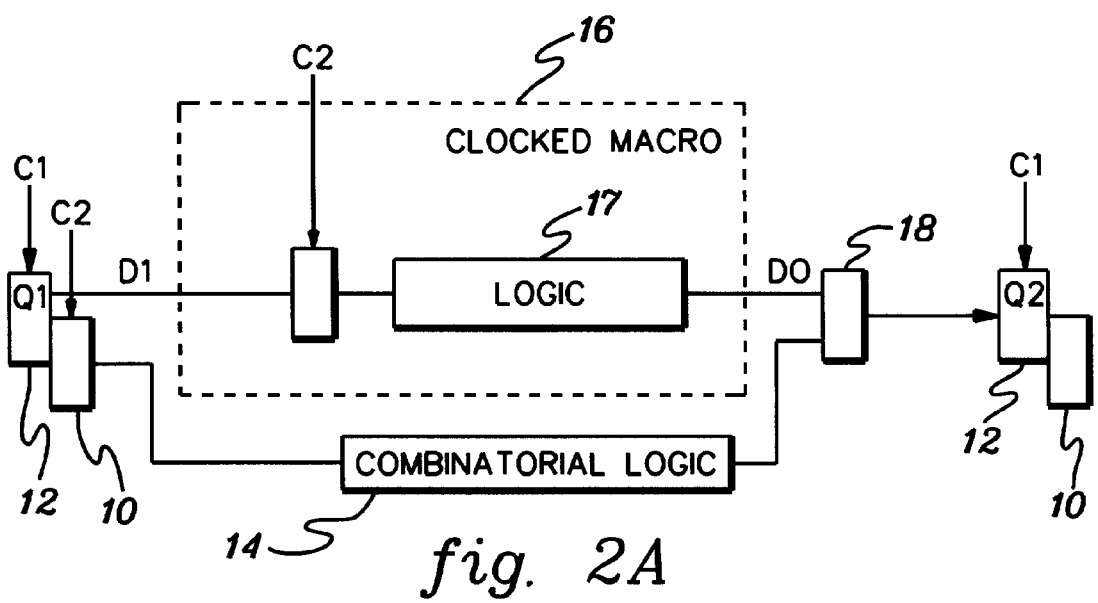
FIG. 2A is a representative block diagram according to FIG. 1A showing the inventional embedding of a clocked macro comprising dynamic logic circuits into a static environment where some static combinatorial logic is connected in parallel between the LSSD typical master-slave latches and FIG. 2B is the associated time behavior of the relevant signals during one cycle.
Figure 2B:
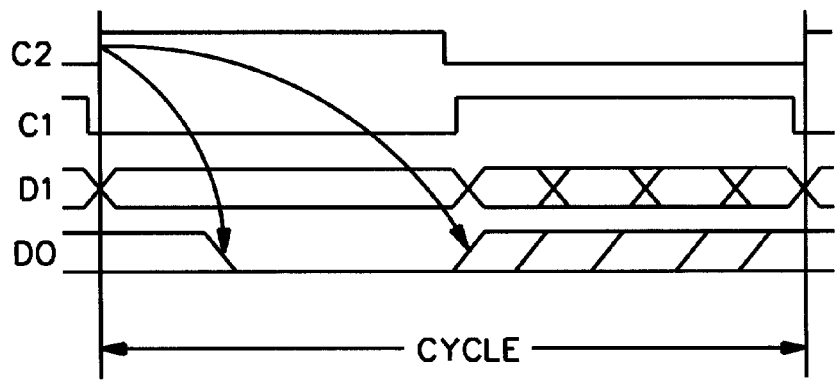

According to a preferred embodiment of the present invention as schematically illustrated in FIG. 2A the dynamic logic circuit embedding denoted as 'clocked macro' as a whole and defined by a dotted frame in the drawing can now be used for high level logic simulation and for the static timer according to LSSD testing methods. The dynamic logic circuit per se is depicted with reference sign 17.

In particular, the data is presented to the C2 clocked macro 16 from the C1 clocked Master latch 12 denoted as Q1. The C1 latch 12 is transparent to the previous path until the trailing edge of C1—see the second row in the lower part of the drawing. The data is received by the input latch 10 with the leading edge of the C2 clock 12 which is the starting point for the signal propagation through the dynamic logic 17.

The output of the macro 16 is captured with the C1-latch 12 Q2. The maximum path delay for the clocked macro stretches from the leading edge of the C2 clock 10 to the trailing edge of the C1 clock 12.

Furthermore, outputs of the clocked macro can be combined with signals from combinatorial paths and the result can be captured in the receiving master latch 12 (Q2). For doing that the output signals of both logic circuits 14, 16 may be processed in any static logic gate 18 as desired by the logic scheme and time remains in the cycle. Thus, this inventional embedding schema is extendible for switching some static combinatorial logic 14 in parallel to the dynamic logic circuit 16. The logic 14 can simply be inserted between the output of the clocked macro and the receiving latch if the clocked macro does not fill the complete cycle.

The restriction of the underlying embedding scheme is that there should not be logic or long wires between the sending latch 12 (Q1) and the clocked macro, otherwise it would not be sure that the input signals to the clocked macro are stable before the evaluation is started by the leading edge of C2.

It is a characteristic feature of dynamic circuits that input signals are not allowed to switch after evaluation has been started, since evaluation only works in one direction and dynamic circuits can not recover from false switching.

In this 'ideal' scheme shown in the FIG. 2A, the input setup time to the macro 16 is guaranteed by the clock separation between the trailing edge of C1 and the leading edge of C2. Thus, the clocked macro should be the first component in the cycle, starting with the leading edge C2.

Static paths and dynamic macros can both be driven from the same sending master-slave latch depicted most left in the drawing. The dynamic path 16 is fed from the master 12, whereas the static path 14 is fed from the slave 10 of the same latch.

Figure 3A:
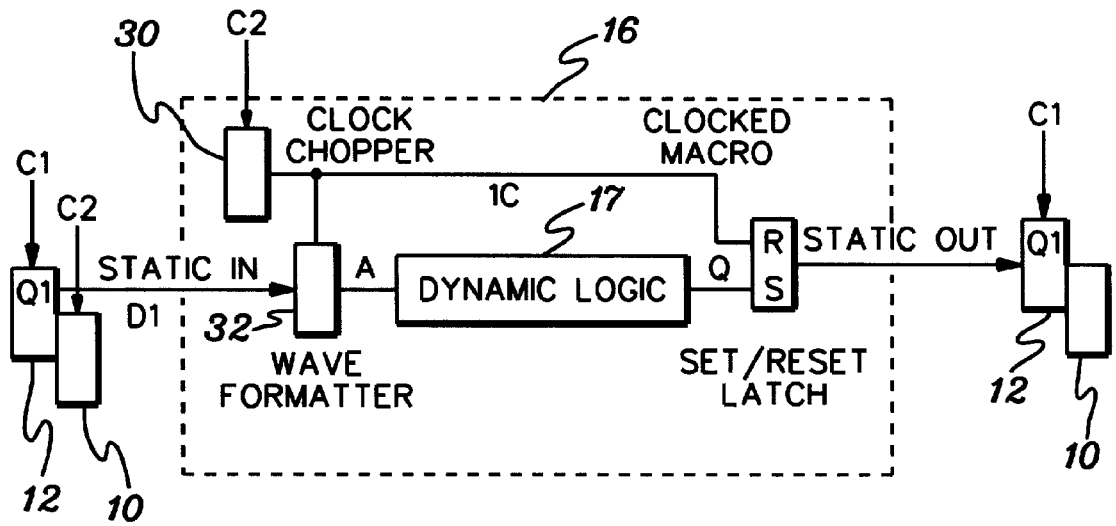
FIG. 3A is a schematic block diagram showing details of the clocked macro depicted in FIG. 2A.
Figure 3B:
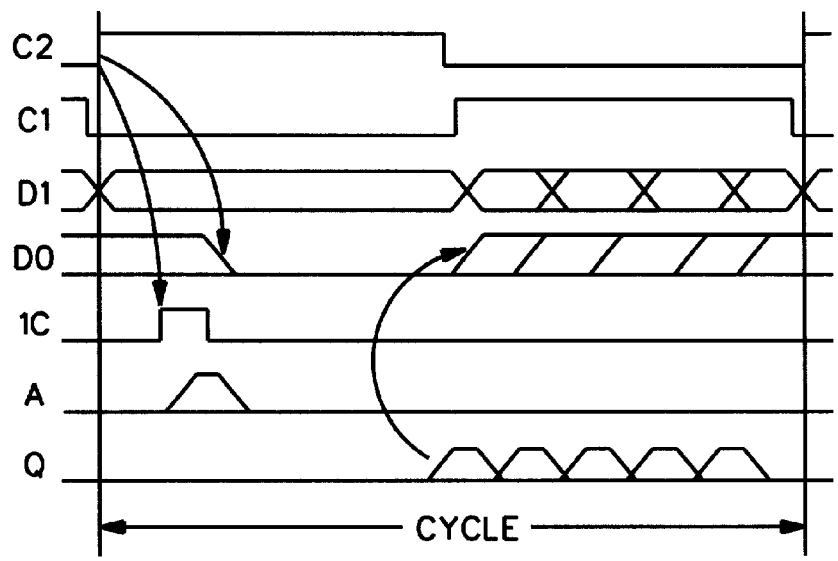
FIG. 3B is the respective signals relevant for the present invention purposes during one static cycle.

With reference now to FIGS. 3A and 3B a schematic block diagram showing some details of the structural realization of the clocked macro depicted in FIG. 2A, and the respective signals relevant for the present invention's purposes during one static cycle will be described next below.

Data IN and data OUT signals are static data, to allow universal usage of the macro with in a static circuit environment, see the arrow in the upper part of the drawing. The Q1 clock 12 Q2 clock 10 pair depicted in FIG. 2A is depicted here as well.

External signal timings such as setup, hold, delay are all specified relative to the leading edge of the macro clock C2.

With reference now to the peculiarities imposed by dynamic logic circuits, a pulse is to be applied as input signal instead of allowing a signal to stay active for a full cycle as it is the case with static logic.

In dynamic circuits 'precharge' is required for bringing the dynamic logic into a 'biased' unique state prior to any evaluation taking place inside the logic. To allow precharging, all signals of a certain stage of dynamic logic have to be inactive for the time precharge is active. The pulse amplitude being low or high reflects the logic value of the input signal.

If the dynamic logic evaluation results in a logic output value 'one', then a pulse appears at the output Q. If the dynamic logic evaluation results in a logic output value 'zero' the output stays at the precharge level.

It is advantageous in CMOS technology to employ NMOS stacks as evaluation trees. Thus, a precharge state is a high state. As mentioned above precharge is required for bringing the dynamic logic into a 'biased' unique state prior to any evaluation taking place inside the logic. The state is to be the same and is to fit to the utilized NMOS or PMOS design, respectively.

As in any LSSD compliant prior art static logic environment no such pulses are present per se, according to the invention such a pulse is generated separately for each dynamic logic 'island' in a 'sea' of static logic by a 'wave' or 'pulse' formatting element 32—working in cooperation with the clock chopper 30—switched pre-connected to the dynamic logic circuit, i.e., as an input element thereof.

Thus, according to the depicted embodiment the macro internal clock is generated through a clock chopper 30 which forms a pulse of a predetermined length generated by a built-in circuit delay, see the fifth row in the figure. The width of the internal clock is dependent on the implemented dynamic logic and the overall clocking schema. To design the internal clock so that it is inactive before the clock C1 becomes active again solves any potential data-hold problems at the input stages. As mentioned before, dynamic logic can not recover from false switching which means that the input signals have to be stable for the complete evaluation time of the input stages. All internal timing depends on this internal clock and therefore on the leading edge of the macro clock—see the first row of the lower part of the drawing.

In general, the input stage 32 of the clocked macro thus has to perform a 'wave formatting' process, of which the depicted pulse is a particular case. Typically, this is a true-complement generator, but it can also be a logic stage, gated by the clock. Since in the given example the evaluation trees are NMOS transistors, the signals propagating through the dynamic logic have to be formatted to a return-to-zero wave form. The input signals get AND-ed with the internal clock signal generated by the clock chopper 30 in the wave formatter stages 32. The generated pulse is low if the internal clock IC is inactive and stays low if the input is low even when the IC becomes active. It should be noted that the signal after the wave formatter 32, depicted in the drawing as 'A' will switch to high if the input is a ONE and the internal clock is active, forming a pulse with the width of IC. Vice versa, a positive pulse is generated for a potential complement output (A comp.) if the input is ZERO and the complement output of formatter 32 will stay at the precharge level for the case a ONE is applied at the input.

The output of the clocked macro is driven by a SET/RESET latch 34. The latch is reset directly by the macro clock, in the described embodiment at the beginning of the cycle, and is set by the result of the evaluation trough the logic path. To prevent unnecessary switching of this output-latch, the reset pulse can advantageously be further processed. For example, no reset is generated if the static input pattern to the clocked macro stays unchanged to the previous cycle which causes that the result of the evaluation will be the same as in the previous cycle. Another method is to delay the reset to the time window of the expected output pulse of the dynamic logic and gate the reset pulse by the evaluated pulse. By this way only one pulse hits the S/R-latch, either a SET or a RESET pulse.

In FIG. 3B the time scheme of all relevant signals is depicted schematically.

C2 is the slave clock signal,

C1 is the master clock signal,

DI is the DATA IN signal,

DO is the DATA OUT signal,

IC is the dynamic logic internal clock signal,

A is the pulse signal before entering the dynamic logic,

Q is the pulse signal after leaving the dynamic logic.

The timing scheme of the signals is shown for both DI input states, low and high.

IC is the macro internal clock signal. The rising edge is derived from the rising edge of the external macro clock C2. The width of the pulse IC is predetermined by the clock chopper circuitry.

DI is the static input signal applied to the clocked macro. DI is launched by the clock C1 from master latch Q1. The signal is stable for the time C1 is inactive, i.e., the left side of the diagram, and can potentially perform transitions during the time C1 is active—right side. The latch Q1 is transparent during the time C1 is active and the output of Q1 will follow the input to Q1.

A is the output of the wave formatting stage 32. The logic state information of DI is combined with the timing information of IC.

A stays at the precharge level for an inactive state, a pulse is generated representing an active state. A can be interpreted as being a representative, i.e., a place holder for a multitude of inputs to be combined by the dynamic logic.

Q is the output of the dynamic logic combining the inputs. The output will switch dependent on the delay of the implemented logic shown by the multitude of possible pulses shown to the right. Off course, only one pulse is generated per dynamic output. Q is used as Set pulse for the S/R latch. Q, as well, represents a multitude of outputs of the dynamic logic.

DO is the output of the clocked macro driven by the S/R latch.

DO is reset by a derivative of the internal clock IC and therefore directly dependent from leading edge C2 in the beginning of hte cycle in the described embodiment. This is indicated by the arrow from C2 to DO falling. The R/S-latch is SET by a potential output pulse Q of the dynamic logic which is dependent timewise from the delay through the dynamic logic. Possible transitions are indicated to the right of the diagram. DO represents the multitude of outputs of the clocked macro which can be timed differently, dependent on the implementation. In FIG. 2B, basically the same applies for DI and DO signals as described here shortly above. In FIG. 1B, this applies basically for DL corresponding to DI, and DC corresponding to DO.

As can be appreciated from the foregoing description, in a more general sense the basic inventional concept thus discloses some input adapter means—the elements 30 and 32 and some output adapter means—the SET/RESET latch 34—and thus adapts the dynamic logic to the requirements established by LSSD compliant prior art static logic. Thus, the present invention provides for embedding dynamic logic into static logic as it is claimed in here.

In the foregoing specification the invention has been described with reference to a specific exemplary embodiment thereof. It will, however, be evident that various modifications and changes may be made thereto without departing from the broader spirit and scope of the invention as set forth in the appended claims. The specification and drawings are accordingly to be regarded as illustrative rather than in a restrictive sense.

In the specific exemplary embodiment described before the logic circuit concept proposed is preferably chosen 'delayed reset'. The inventional circuits, however, are not limited to this circuit type and can be used within any logic chip, like processor chips or others.

It should be noted that the circuit type used should be chosen such that it fits best to the required function of the circuit.

What is claimed is:

1. A method for embedding dynamic logic circuits in a static level-sensitive scan design complaint hardware environment, said method comprising:
   processing static input signals from static latches with wave formatting means in order to generate a wave form usable for an evaluation by a dynamic logic circuit;
   feeding the wave-formatted signal to said dynamic logic circuit; and
   converting the dynamic logic output signal back to static such that the dynamic logic output signal can be latched by a clock signal of a static embedding circuit.

2. A static hardware circuit comprising:
   one or more embedded dynamic logic circuits, wherein each dynamic logic circuit is embedded by input adapter means for generating an evaluation signal required by said dynamic logic circuit; and
   output adapter means for converting the evaluation result of said dynamic logic circuit back to static signals.

3. The hardware circuit of claim 2, in which said input adapter means are wave formatting means, and said output adapter means are means for storing the dynamic logic evaluation result such that the dynamic logic evaluation result can be latched by a clock signal of a static embedding circuit.

4. The hardware circuit of claim 3 being a memory array.

5. The hardware circuit of claim 3 being an instruction window buffer.

6. The hardware circuit of claim 2, wherein said output adapter means is a set/reset latch.

7. The hardware circuit of claim 2, wherein said input adapter means includes a clock chopper and a wave formatter.

8. A logic chip comprising a hardware circuit, said hardware circuit comprising:
   one or more embedded dynamic logic circuits, wherein each dynamic logic circuit is embedded by input adapter means for generating an evaluation signal required by said dynamic logic circuit; and
   output adapter means for converting the evaluation result of said dynamic logic circuit back to static signals.

9. The logic chip of claim 8, in which said input adapter means are wave formatting means, and said output adapter means are means for storing the dynamic logic evaluation result such that the dynamic logic evaluation result can be latched by a clock signal of a static embedding circuit.

10. The logic chip of claim 8, wherein said output adapter means is a set/reset latch.

11. The logic chip of claim 8, wherein said input adapter means includes a clock chopper and a wave formatter.

12. Computer system comprising a hardware circuit, said hardware circuit comprising:
   one or more embedded dynamic logic circuits, wherein each dynamic logic circuit is embedded by input adapter means for generating an evaluation signal required by said dynamic logic circuit; and
   output adapter means for converting the evaluation result of said dynamic logic circuit back to static signals.

13. The computer system of claim 12, in which said input adapter means are wave formatting means, and said output adapter means are means for storing the dynamic logic evaluation result such that the dynamic logic evaluation result can be latched by a clock signal of a static embedding circuit.

14. The computer system of claim 13, wherein said output adapter means is a set/reset latch.

15. The logic chip of claim 13, wherein said input adapter means includes a clock chopper and a wave formatter.

16. A method comprising:
   feeding data from a master static latch of a sending master-slave latch to a clocked dynamic macro;
   feeding data from a slave static latch of the sending master-slave latch to a combinatorial logic circuit, said combinatorial logic circuit in parallel to the clocked dynamic macro;
   combining outputs of the clocked dynamic macro and the combinatorial logic circuit;
   processing the combined outputs in a static logic gate; and
   capturing the processed combined outputs in a receiving master static latch.

17. A static hardware circuit comprising:
   a sending master-slave static latch including a master static latch and a slave static latch;
   a clocked dynamic macro, said clocked dynamic macro receiving data from the master static latch, said clocked dynamic macro comprising a dynamic logic circuit and an input adapter means for generating an evaluation signal required by the dynamic logic circuit and for clocking the dynamic macro;
   a combinatorial logic circuit in parallel to the clocked dynamic macro, said combinatorial logic circuit receiving data from the slave static latch;
   a static logic gate, said static logic gate receives and processes the outputs from the clocked dynamic macro and the combinatorial logic circuit; and
   a receiving master static latch, said second master latch capturing the processed outputs from the static logic gate.

18. The static hardware circuit of claim 17, wherein the static logic gate is a set/reset latch.

19. The static hardware circuit of claim 17, wherein the input adapter means includes a clock chopper and a wave formatter.

* * * * *